United States Patent
Cai et al.

(10) Patent No.: US 10,153,717 B2
(45) Date of Patent: Dec. 11, 2018

(54) MAGNETIC SENSOR INTEGRATED CIRCUIT, MOTOR ASSEMBLY AND APPLICATION DEVICE

(71) Applicant: Johnson Electric S.A., Murten (CH)

(72) Inventors: Guang Jie Cai, Hong Kong (CN); Chun Fai Wong, Hong Kong (CN)

(73) Assignee: JOHNSON ELECTRIC S.A., Murten (CH)

(*) Notice: Subject to any disclaimer, the term of this patent is extended or adjusted under 35 U.S.C. 154(b) by 0 days.

(21) Appl. No.: 15/495,226

(22) Filed: Apr. 24, 2017

(65) Prior Publication Data

US 2017/0310254 A1    Oct. 26, 2017

(30) Foreign Application Priority Data

Apr. 26, 2016 (CN) .......................... 2016 1 0266586
Jun. 2, 2016 (CN) .......................... 2016 1 0390068

(51) Int. Cl.

| | |
|---|---|
| *H02P 6/16* | (2016.01) |
| *H02K 11/215* | (2016.01) |
| *H02P 6/26* | (2016.01) |
| *G01R 33/00* | (2006.01) |

(52) U.S. Cl.
CPC ............ *H02P 6/16* (2013.01); *G01R 33/0017* (2013.01); *H02K 11/215* (2016.01); *H02P 6/26* (2016.02)

(58) Field of Classification Search
CPC ...... G01R 33/0017; H02K 11/215; H02P 6/16
See application file for complete search history.

(56) References Cited

U.S. PATENT DOCUMENTS

| | | | | |
|---|---|---|---|---|
| 2002/0027488 | A1* | 3/2002 | Hayat-Dawoodi | H01L 27/22 335/78 |
| 2007/0057670 | A1* | 3/2007 | Kobayashi | G01R 33/04 324/253 |
| 2010/0045268 | A1* | 2/2010 | Kilian | H03K 19/18 324/207.2 |
| 2011/0074405 | A1* | 3/2011 | Doogue | G01R 33/0023 324/251 |
| 2013/0271125 | A1* | 10/2013 | Deak | G01R 31/025 324/252 |
| 2014/0070785 | A1* | 3/2014 | Galloway | H02M 3/1582 323/285 |
| 2014/0103921 | A1* | 4/2014 | Raman | G01R 33/0023 324/251 |

(Continued)

*Primary Examiner* — Muhammad S Islam
(74) *Attorney, Agent, or Firm* — Muncy, Geissler, Olds & Lowe, P.C.

(57) ABSTRACT

A magnetic sensor integrated circuit, a motor assembly and an application device are provided. The magnetic sensor integrated circuit includes a magnetic field detection circuit. The magnetic field detection circuit includes a magnetic sensing element configured to sense an external magnetic field and output an electrical detection signal, a signal processing unit configured to perform amplification and interference rejection on the electrical detection signal to generate an analog electrical signal, and a comparator configured to compare the analog electrical signal with a reference voltage, and output magnet detection signal corresponding to the external magnetic field. The reference voltage is generated based on an input common-mode voltage of the magnetic field detection circuit.

17 Claims, 7 Drawing Sheets

(56) References Cited

U.S. PATENT DOCUMENTS

2015/0130451 A1\* 5/2015 Bertin .............. G01R 33/0017
                                                        324/207.25
2015/0222192 A1\* 8/2015 Freeman ............... H02M 1/08
                                                        363/21.09

\* cited by examiner

MAGNETIC SENSOR INTEGRATED CIRCUIT, MOTOR ASSEMBLY AND APPLICATION DEVICE

CROSS REFERENCE TO RELATED APPLICATIONS

This non-provisional patent application claims priorities under 35 U.S.C. § 119(a) from Patent Application No. CN201610266586.5, filed in The People's Republic of China on 26 Apr. 2016 and Patent Application No. CN201610390068.4, filed in The People's Republic of China on 2 Jun. 2016.

FIELD

The disclosure relates to the technical field of electronic circuits, and particularly to a magnetic sensor integrated circuit.

BACKGROUND

Magnetic sensor integrated circuits are widely used in electronic products and modern industry. The magnetic sensor integrated circuit is capable of detecting an external magnetic field information and converting the detected information into an electrical signal.

Some magnetic sensor integrated circuits are provided with comparators. The comparator is configured for comparing the electrical signal with a reference voltage, so as to determine a polarity of an external field. In the conventional technology, the reference voltage of the comparator is generally generated by a power module in the magnetic sensor integrated circuit based on a constant reference voltage, which is generated by an internal bandgap reference voltage source. In this case, the power module in the magnetic sensor integrated circuit is complicated and costly.

SUMMARY

In an aspect of the present disclosure, a magnetic sensor integrated circuit is provided, which includes:
  a housing;
  a semiconductor substrate arranged inside the housing;
  an electronic circuit provided on the semiconductor substrate; and
  an output port extending out from the housing and an input port for connecting with an external power supply,
  where the electronic circuit includes a magnetic field detection circuit including:
    a magnetic sensing element configured to sense an external magnetic field and output an electrical detection signal,
    a signal processing unit configured to amplify the electrical detection signal and remove interference from the electrical detection signal to generate an analog electrical signal, and
    a comparator configured to compare the analog electrical signal with a reference voltage, and output magnet detection signal corresponding to the external magnetic field, where the reference voltage is generated based on an input common-mode voltage of the magnetic field detection circuit.

Preferably, the magnetic sensing element may be powered by a constant current source.

Preferably, the reference voltage may vary with the input common-mode voltage.

Preferably, the reference voltage may include an high voltage threshold and a low voltage threshold acquired by a pair of differential reference voltages being subtracted from each other;
  the analog electrical signal may include a pair of differential voltage signals; and
  the comparator may include a first comparator, a second comparator and a latch logic circuit, where each of the first comparator and the second comparator is provided with four input terminals, and the four input terminals respectively receive the pair of differential reference voltages and the pair of differential voltage signals, the pair of differential reference voltages being inversely coupled to the second comparator as compared with the first comparator, where
  the first comparator is configured to output a comparison result between a voltage difference of the pair of differential voltage signals and the high voltage threshold,
  the second comparator is configured to output a comparison result between the voltage difference and the low voltage threshold, and
  the latch logic circuit is configured to:
    output a first level in a case that the comparison result output by the first comparator indicates that the voltage difference is higher than the higher level,
    output a second level in a case that the comparison result output by the second comparator indicates that the voltage difference is lower than the lower level, with the second level being opposite to the first level, and maintain an output state unchanged in a case that the comparison results output by the first comparator and the second comparator indicate that the voltage difference is between the high voltage threshold and the low voltage threshold.

Preferably, the electrical detection signal may include a magnetic field signal and a deviation signal; and the signal processing unit may include a chopping switch, a chopper amplifier and a low-pass filter, where
  the chopping switch is configured to separate the electrical detection signal output by the magnetic sensing element into the deviation signal in a baseband frequency and the magnetic field signal in a chopping frequency,
  the chopper amplifier is configured to amplify the deviation signal and the magnetic field signal which are obtained by splitting the electrical detection signal, and convert the amplified deviation signal in the baseband frequency and the amplified magnetic field signal in the chopping frequency into the chopping frequency and the baseband frequency respectively, and the low-pass filter is configured to filter out the deviation signal switched into the chopping frequency.

Preferably, the magnetic sensor integrated circuit may further include a power module, where the power module may include a rectifier, and the rectifier may have an input terminal connected with the input port and may be configured to convert a voltage provided by the external power supply into a first DC voltage.

Preferably, the power module may further include a voltage regulating unit configured to convert the first DC voltage output by the rectifier into a second DC voltage, with an average of the first DC voltage being greater than an average of the second DC voltage.

Preferably, the power module may further include a current source generation circuit, and the current source generation circuit may be powered by the second DC voltage and may be configured to generate a constant current source which does not change with temperature; and the magnetic sensing element may be powered by the constant current source.

Preferably, the signal processing unit may include an amplifier configured to amplify the electrical detection signal, and a filter configured to filter out an interference signal in the electrical detection signal; and the input common-mode voltage may be input into the amplifier and the filter.

Preferably, the magnetic field detection circuit may be powered by the second DC voltage; and the input common-mode voltage may be half of the second DC voltage.

Preferably, the magnetic sensor integrated circuit may further include a reference voltage generation circuit, the reference voltage generation circuit may include a voltage detection circuit and a voltage divider, where
  the voltage detection circuit is configured to detect a difference between the input common-mode voltage and a reference common-mode voltage and output a corresponding detection current, and
  the voltage divider is provided with a pair of output terminals for outputting the pair of differential reference voltages and an output terminal for outputting the reference common-mode voltage, where when the detection current flows through the voltage divider, a variation in the detection current causes the reference voltage output by the voltage divider to change correspondingly.

Preferably, the magnetic sensor integrated circuit may further include an output control circuit configured to enable, based on at least the magnet detection signal, the magnetic sensor integrated circuit to operate in at least one of a first state in which a current flows outwards from the output port and a second state in which a current flows into the output port from outside.

Preferably, the output control circuit may include a first switch and a second switch, where the first switch and the output port may be connected in a first current path, and the second switch and the output port may be connected in a second current path, with a direction of the second current path being opposite to a direction of the first current path, where the first current path and the second current path may be controlled to be selectively conducted based on the magnet detection signal.

Preferably, the output control circuit comprises a first current path in which a current flows from the output port to an outside, a second current path in which a current flows from the output port to an inside, and a switch electrically connected to one of the first current path and the second current path; and the switch is controlled by magnetic field detection signal output by the signal processing unit, to switch on the first current path and the second current path selectively.

Preferably, the external power supply may be an AC power supply; and the output control circuit may be configured to: enable the magnetic sensor integrated circuit to operate in one of the first state and the second state in a case that the magnetic detection signal indicates that the external magnetic field is a first polarity, and the AC power supply operates in a first half cycle, and enable the magnetic sensor integrated circuit to operate in the other one of the first state and the second state in a case that the magnetic detection signal indicates that the e external magnetic field is a second polarity, and the AC power supply operates in a second half cycle.

Preferably, the electrical detection signal comprises a magnetic field signal and a deviation signal, the signal processing unit comprises:
  a chopping switch configured to modulate the deviation signal to a baseband frequency and the magnetic field signal to a chopping frequency, respectively;
  a high-pass filter configured filter out the deviation signal in the frequency; and
a demodulator configured to demodulate the magnetic field signal to the baseband frequency.

In another aspect of the present disclosure, a motor assembly is provided, which includes a motor and a motor drive circuit, where the motor drive circuit includes the magnetic sensor integrated circuit according to any one of the above.

Preferably, the motor may include a stator and a permanent magnet rotor, and the stator may include a stator core and a single-phase winding wound on the stator score.

In another aspect of the present disclosure, an application device is provided, which includes the motor assembly, where the motor assembly includes the magnetic sensor integrated circuit according to any one of the above.

Preferably, the application device may be a pump, a fan, a household appliance or a vehicle.

BRIEF DESCRIPTION OF THE DRAWINGS

The drawings to be used in the description of the embodiments or the conventional technology are described briefly as follows, so that the technical solutions according to the embodiments of the present disclosure or according to the conventional technology become clearer. It is apparent that the drawings in the following description only illustrate some embodiments of the present disclosure. For those skilled in the art, other drawings may be obtained according to these drawings without any creative work.

DETAILED DESCRIPTION OF THE EMBODIMENTS

Figure 1:
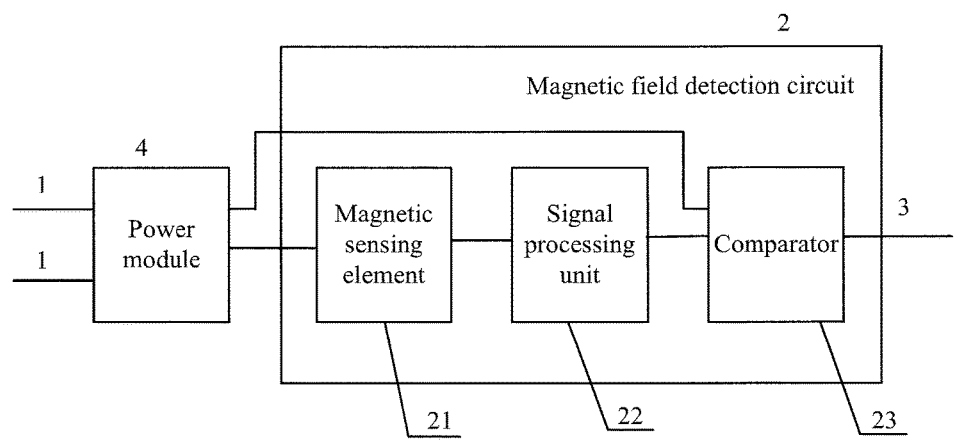
FIG. 1 is a schematic structural diagram of a magnetic sensor integrated circuit according to an embodiment of the present disclosure.

As shown in FIG. 1, a magnetic sensor integrated circuit according to an embodiment of the present disclosure includes a housing, a semiconductor substrate arranged inside the housing, an electronic circuit provided on the semiconductor substrate, and an output port 3 extending out from the housing and an input port 1 for connecting with an external power supply. The electronic circuit includes a magnetic field detection circuit 2.

The magnetic field detection circuit 2 includes a magnetic sensing element 21, a signal processing unit 22 and a comparator 23.

The magnetic sensing element 21 is configured to sense an external magnetic field and output an electrical detection signal.

The signal processing unit 22 is configured to amplify the electrical detection signal and remove interference from the electrical detection signal to generate an analog electrical signal.

The comparator 23 is configured to compare the analog electrical signal with a reference voltage, and output a magnet detection signal corresponding to the external magnetic field. The reference voltage is generated based on an input common-mode voltage of the magnetic field detection circuit.

In this embodiment, the magnet detection signal may be output from the output port 3.

In the magnetic sensor integrated circuit according to this embodiment, the reference voltage is generated based the input common-mode voltage, and may change with fluctuations in a supply voltage and the input common-mode voltage, thereby ensuring an accuracy and reliability of the magnet detection signal output by the comparator. Therefore, the magnetic sensor integrated circuit according to this embodiment has a low requirement for its power module, and the circuit is simple and of low cost.

Preferably, the magnetic sensing element 21 is powered by a constant current source.

In an implementation, the magnetic sensing element 21 may be powered by a constant voltage source or a constant current source. In this embodiment, the constant current source is adopted such that a power module powered by the constant current source is capable of outputting a constant voltage without a bandgap reference voltage source, thus the entire power module is simple in structure.

Preferably, the comparator 23 may be a hysteresis comparator.

Preferably, the reference voltage includes a high voltage threshold Rh and a low voltage threshold R1 acquired by a pair of differential reference voltages (VH and VL) being subtracted from each other. Specifically, the high voltage threshold Rh is acquired by subtracting VL from VH, and the low voltage threshold R1 is acquired by subtracting VH from VL. The analog electrical signal output by the signal processing unit includes a pair of differential voltage signals (P3 and N3).

Figure 2:
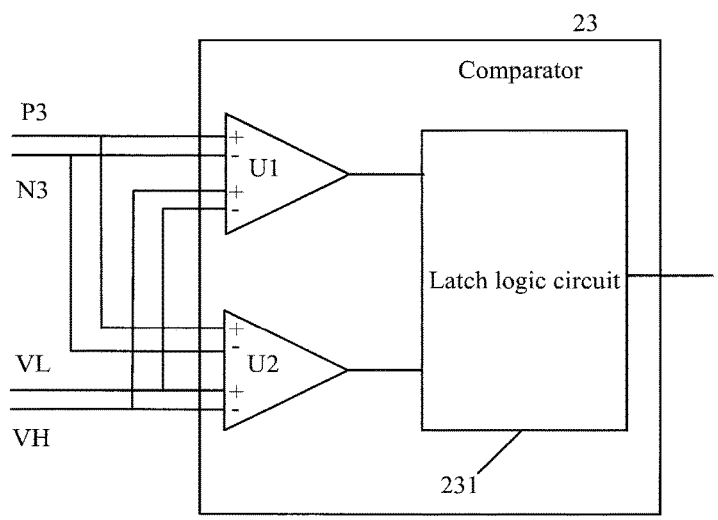
FIG. 2 is a schematic structural diagram of a comparator of a magnetic sensor integrated circuit according to an embodiment of the present disclosure.

As shown in FIG. 2, the comparator 23 includes a first comparator U1, a second comparator U2 and a latch logic circuit 231. Each of the first comparator U1 and the second comparator U2 is provided with four input terminals, and the four input terminals respectively receive the pair of differential reference voltages (VH and VL) and the pair of differential voltage signals (P3 and N3). Non-inverting input terminals of each of the first comparator U1 and the second comparator U2 receive a positive signal P3 of the pair of differential voltage signals, and inverting input terminals of each of the first comparator U1 and the second comparator U2 receive a negative signal N3 of the pair of differential voltage signals. A non-inverting reference input terminal of the first comparator U1 is coupled with the positive voltage VH of the pair of differential reference voltages, and an inverting reference input terminal of the first comparator U1 is coupled with the negative voltage VL of the pair of differential reference voltages. A non-inverting reference input terminal of the second comparator U2 is coupled with the negative voltage VL of the pair of differential reference voltages, and an inverting reference input terminal of the second comparator U2 is coupled with the positive voltage VH of the pair of differential reference voltages. That is, the pair of differential reference voltages is inversely coupled with the second comparator U2 as compared with the first comparator U1.

The first comparator U1 is configured to output a comparison result between a voltage difference (P3−N3) of the pair of differential voltage signals and the high voltage threshold Rh.

The second comparator U2 is configured to output a comparison result between the voltage difference (P3−N3) and the low voltage threshold R1.

The latch logic circuit 231 is configured to output a first level in a case that the comparison result output by the first comparator U1 indicates that the voltage difference is larger than the high voltage threshold, that is, (P3−N3)>(VH−VL). The latch logic circuit 231 is configured to output a second level in a case that the comparison result output by the second comparator U2 indicates that the voltage difference is lower than the low voltage threshold, that is, (P3−N3)<(VL−VH). The second level is opposite to the first level. The latch logic circuit 231 is configured to maintain an output state unchanged in a case that the comparison results output by the first comparator U1 and the second comparator U2 indicate that the voltage difference is between the high voltage threshold and the low voltage threshold, that is, (VL−VH)<(P3−N3)<(VH−VL).

Figure 3:
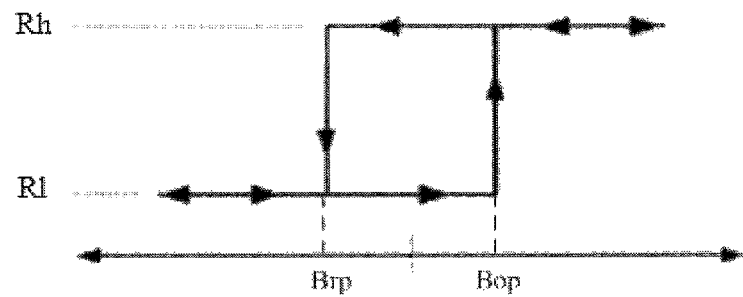
FIG. 3 is a waveform diagram of signals of the comparator of a magnetic sensor integrated circuit according to an embodiment of the present disclosure.

Referring to FIG. 3, the latch logic circuit 231 is configured to enable the comparator 23 to output the first level (for example, a high level) in a case that the comparison result output by the first comparator U is (P3−N3)>Rh, where Rh=(VH−VL), or a magnetic field strength of the external magnetic field reaches an operation point Bop, which indicates that the external magnetic field is of one polarity. The latch logic circuit 231 is configured to enable the comparator 23 to output the second level (for example, a low level) in a case that the comparison result output by the second comparator U2 is (P3−N3)<R1, where R1=(VL−VH), or the magnetic field strength of the external magnetic field does not reach a release point Brp, which indicates that the external magnetic field is of the other polarity. The latch logic circuit 231 is configured to enable the comparator 23 to maintain an output state unchanged in a case that R1<

(P3−N3)<Rh, or the magnetic field strength of the external magnetic field is between the operation point Bop and the release point Brp.

The signal processing unit 22 includes an amplifier configured to amplify the electrical detection signal, and a filter configured to filter out an interference signal in the electrical detection signal. The input common-mode voltage is input into the amplifier and the filter.

In an embodiment of the present disclosure, the electrical detection signal output by the magnetic sensing element 21 may include a magnetic field signal and a deviation signal. The magnetic field signal is an ideal magnetic field voltage signal detected by the magnetic sensing element 21 which matches the external magnetic field, and the deviation signal is an inherent deviation of the magnetic sensing element 21.

Figure 4:
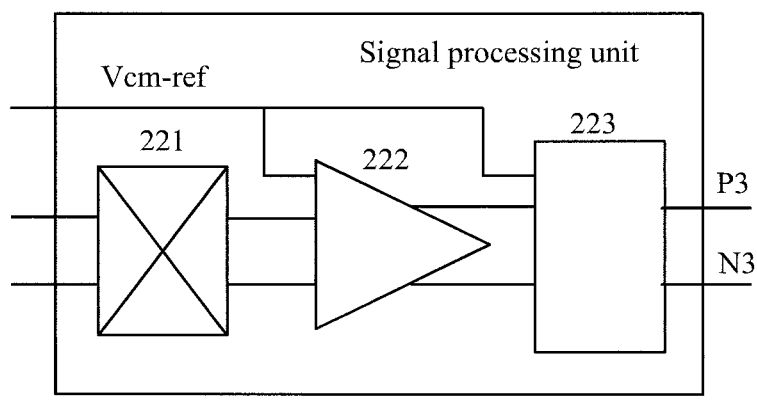
FIG. 4 is a schematic structural diagram of a signal processing unit of a magnetic sensor integrated circuit according to an embodiment of the present disclosure.

Preferably, as shown in FIG. 4, in a specific embodiment, the signal processing unit includes a chopping switch 221, a chopper amplifier 222 and a low-pass filter 223.

The chopping switch 221 is configured to separate the electrical detection signal output by the magnetic sensing element into the deviation signal in a baseband frequency and the magnetic field signal in a chopping frequency.

The chopper amplifier 222 is configured to amplify the deviation signal and the magnetic field signal, and switch the amplified deviation signal and the amplified magnetic field signal into the chopping frequency and the baseband frequency respectively.

The low-pass filter 223 is configured to filter out the deviation signal switched into the chopping frequency.

The chopper amplifier 222 and the low-pass filter 223 both receive the input common-mode voltage Vcm-ref. The low-pass filter 223 outputs the analog electrical signal, i.e., the pair of differential voltage signals (P3 and N3) shown in FIG. 2.

Preferably, the chopping frequency is higher than 100 kHz, and the baseband frequency is lower than 200 Hz.

In this embodiment, the input port is configured for connecting with an external AC power supply. The baseband frequency is proportional to a frequency of the external AC power supply. Specifically, in a possible example, the baseband frequency is equal to a magnetic field variation frequency of the external magnetic field, which is twice the frequency of the external AC power supply.

It should be understood that, the signal processing unit may be configured according to actual conditions. There is no particular limitation to the configurations of the signal processing unit, and any other configurations of the signal processing unit are all within the scope of the present application.

Figure 5:
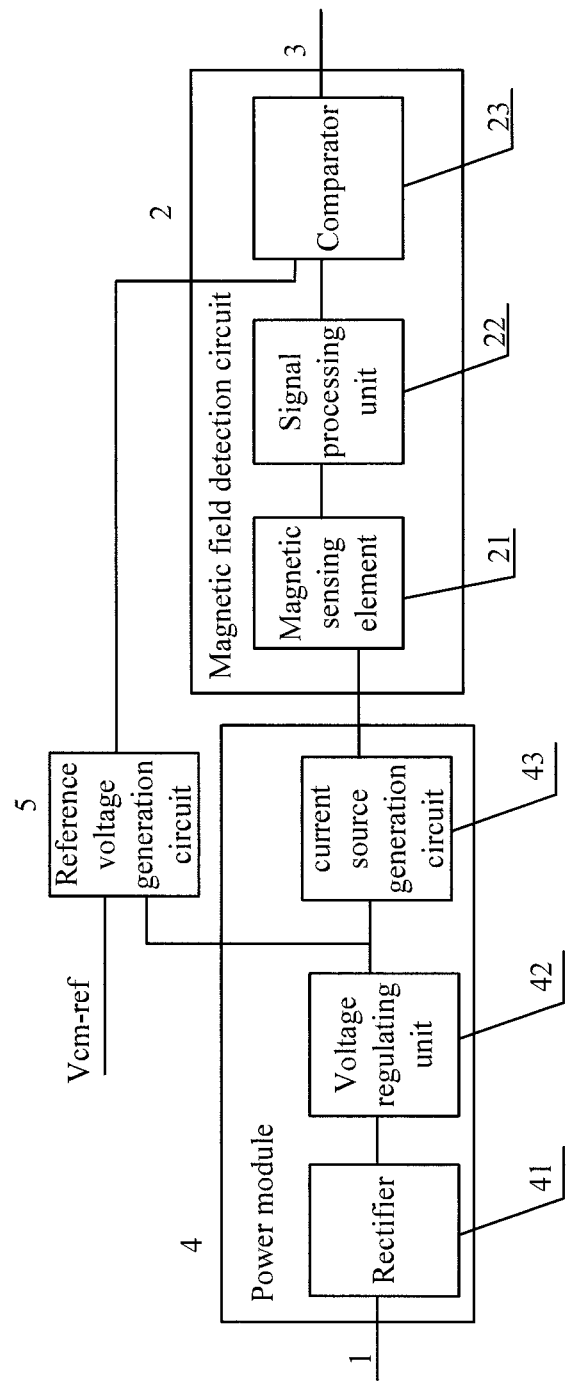
FIG. 5 is a schematic structural diagram of a power module of a magnetic sensor integrated circuit according to an embodiments of the present disclosure.

Preferably, as shown in FIG. 1, the magnetic sensor integrated circuit further includes a power module 4. FIG. 5 illustrates a circuit structure of the power module 4, which includes a rectifier 41, a voltage regulating unit 42 and a current source generation circuit 43.

The rectifier 41 has an input terminal connected with the input port 1, and is configured to convert a voltage provided by the external power supply into a first DC voltage.

The voltage regulating unit 42 is configured to convert the first DC voltage output by the rectifier 41 into a second DC voltage, with an average of the first DC voltage being greater than an average of the second DC voltage. In this embodiment, the voltage regulating unit may include a voltage reduction resistor and a voltage stabilizer which are connected with an output terminal of the rectifier.

The current source generation circuit 43 is powered by the second DC voltage, and is configured to generate a constant current source which does not change with temperature. The magnetic sensing element 21 is powered by the constant current source. In this case, the output of the magnetic sensing element 21 keeps unchanged, even if the ambient temperature changes.

Preferably, the signal processing unit is powered by the second DC voltage. The input common-mode voltage, which is input into the chopper amplifier 222 and the low-pass filter 223, is half of the second DC voltage.

Figure 6:
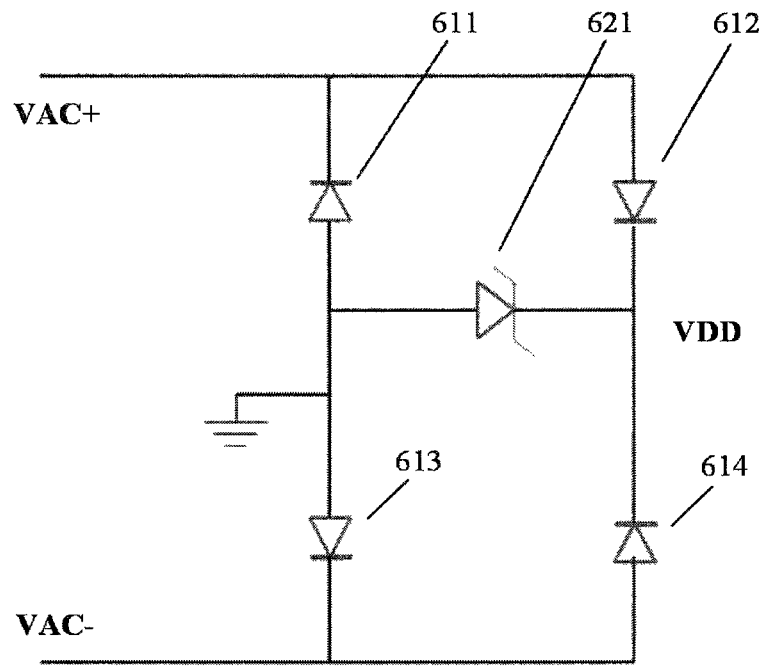
FIG. 6 is a circuit diagram of a rectifier of a magnetic sensor integrated circuit according to an embodiment of the present disclosure.

FIG. 6 illustrates a specific circuit of the rectifier, which includes a full-wave rectification bridge and a voltage stabilizing unit. The voltage stabilizing unit includes a voltage stabilizing diode 621 connected between two output terminals of the full-wave rectification bridge. The full-wave rectification bridge includes a first diode 611 and a second diode 612 which are connected in serial, and a third diode 613 and a fourth diode 614 which are connected in serial. A common terminal between the first diode 611 and the second diode 612 is electrically connected with a first input port VAC+, and a common terminal between the third diode 613 and the fourth diode 614 is electrically connected with a second input port VAC−.

An input terminal of the first diode 611 is electrically connected with an input terminal of the third diode 613 to form a grounded output terminal of the full-wave rectification bridge. An output terminal of the second diode 612 is electrically connected with an output terminal of the fourth diode 614 to form a voltage output terminal VDD of the full-wave rectification bridge. The voltage stabilizing diode 621 is connected between a common terminal between the second diode 612 and the fourth diode 614 and a common terminal between the first diode 611 and the third diode 613. It is to be noted that, in an embodiment of the present disclosure, a power supply terminal of the output control circuit may be electrically connected with the voltage output terminal of the full-wave rectification bridge.

In this embodiment, supply voltages for respective elements of the magnetic sensor integrated circuit are described in detail. Of course, in an implementation, the supply voltages for the respective elements are not limited thereto. The supply voltages for the respective elements may be determined according to specific application conditions, and are all within the scope of the present disclosure.

Figure 7:
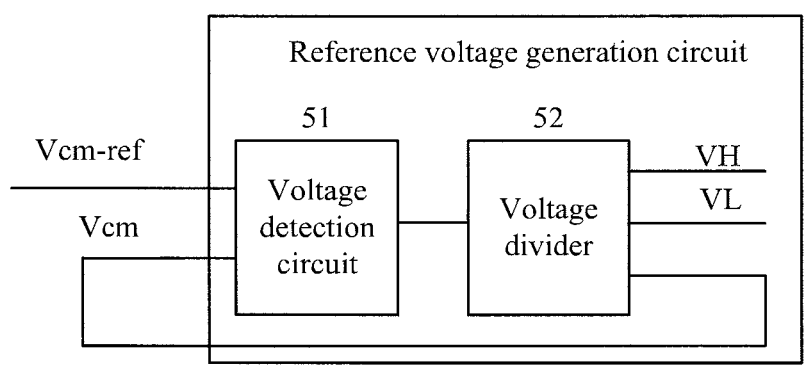
FIG. 7 is a schematic structural diagram of a reference voltage generator of a magnetic sensor integrated circuit according to an embodiment of the present disclosure.

Preferably, as shown in FIG. 5, the magnetic sensor integrated circuit further includes a reference voltage generation circuit 5, and the reference voltage generation circuit 5 includes a voltage detection circuit 51 and a voltage divider 52. FIG. 7 illustrates a circuit structure of the reference voltage generation circuit 5.

The voltage detection circuit 51 is configured to detect a difference between the input common-mode voltage Vcm-ref and a reference common-mode voltage Vcm, and output a corresponding detection current. The voltage divider 52 is provided with a pair of output terminals for outputting the pair of differential reference voltages VH and VL, and an output terminal for outputting the reference common-mode voltage Vcm. When the detection current flows through the voltage divider 52, a variation in the detection current causes the pair of differential reference voltages VH and VL output by the voltage divider 52 and the reference common-mode voltage Vcm to change correspondingly. The reference common-mode voltage Vcm is equal to a voltage difference between the reference common-mode voltage Vcm and the input common-mode voltage Vcm-ref.

In the magnetic sensor integrated circuit according to this embodiment, the magnetic field detection circuit is powered by the second DC voltage output by the voltage regulating unit 42. The second DC voltage may fluctuate, which may cause the electrical detection signal output by the magnetic sensing element to fluctuate accordingly. The reference voltage input into the comparator is generated based on the input common-mode voltage, and may change with the fluctuations in the supply voltage and the input common-mode voltage, thereby ensuring the accuracy and reliability of the magnet detection signal output by the comparator. Therefore, the magnetic sensor integrated circuit according to this embodiment has a low requirement for its power module, and the circuit is simple and of low cost.

Further, the magnetic sensor integrated circuit may further include an output control circuit. The output control circuit receives the magnet detection signal and an output port Pout of the output control circuit is coupled with the output port 3 of the magnetic sensor integrated circuit. The output control circuit is preferably powered by the first DC voltage, and is configured to enable, based on at least the magnet detection signal, the magnetic sensor integrated circuit to operate in at least one of a first state in which a current flows outwards from the output port and a second state in which a current flows into the output port from outside.

In the embodiment, the output control circuit is configured to switch between a first state and a second state. The first state may correspond to a scenario in which a load current flows from inside to outside of the magnetic sensor via the output port, and the second state may correspond to a scenario in which a load current flows from outside to inside the magnetic sensor via output port. In some embodiments, the magnetic sensor may operate in a third status in which, no current flows through output port Preferably, the output control circuit includes a first switch and a second switch. The first switch and the output port are connected in a first current path. The second switch and the output port are connected in a second current path. A direction of the second current path is opposite to a direction of the first current path. The first current path and the second current path are controlled to be selectively conducted based on the magnet detection signal.

Preferably, the first switch may be a triode, and the second switch may be a triode or a diode, which may be determined according to actual conditions and is not limited in the present disclosure.

Figure 8:
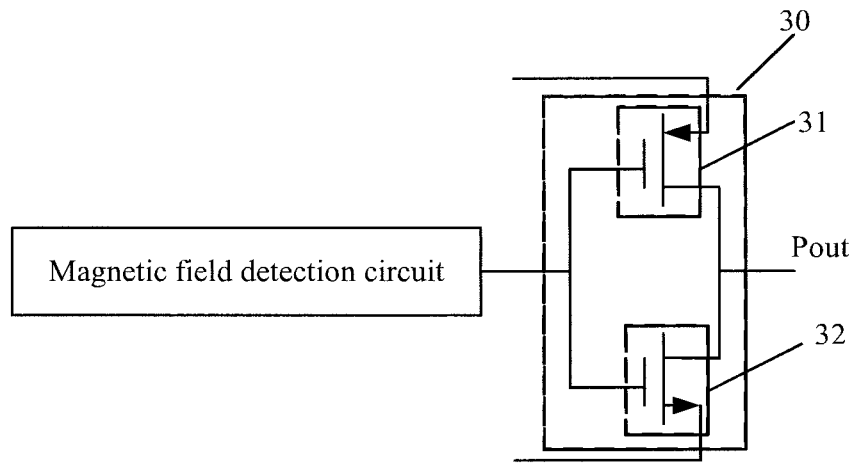
FIG. 8 is a circuit diagram of an output control circuit of a magnetic sensor integrated circuit according to an embodiment of the present disclosure.

Specifically, in an embodiment of the present disclosure, as shown in FIG. 8, the first switch is 31 is switched on at a low level, and the second switch 32 is switched on at a high level. The first switch 31 and the output port Pout are connected in the first current path. The second switch 32 and the output port Pout are connected in the second current path. Control terminals of the first switch 31 and the second switch 32 are connected with the magnetic field detection circuit. A current input terminal of the first switch 31 is connected with a higher voltage (for example, a DC power supply), a current output terminal of the first switch 31 is connected with a current input terminal of the second switch 32, and a current output terminal of the second switch 32 is connected with a lower voltage (for example, the ground). In a case that the magnet detection signal output by the magnetic field detection circuit is a low level, the first switch 31 is switched on, and the second switch 32 is switched off, so that a load current from the higher voltage flows through the first switch 31 and flows outwards from the output port Pout. In a case that the magnet detection signal output by the magnetic field detection circuit is a high level, the second switch 32 is switched on, and the first switch 31 is switched off, so that the load current flows inwards from outside through the output port Pout and flows through the second switch 32. In an example, the first switch 31 is a positive channel metal oxide semiconductor field effect transistor (P-type MOSFET), and the second switch 32 is a negative channel metal oxide semiconductor field effect transistor (N-type MOSFET). It can be understood that, in other embodiments, the first and second switches may be semiconductor switches of other types, for example, may be other field effect transistors such as a junction field effect transistor (JFET) and a metal semiconductor field effect transistor (MESFET).

Figure 9:
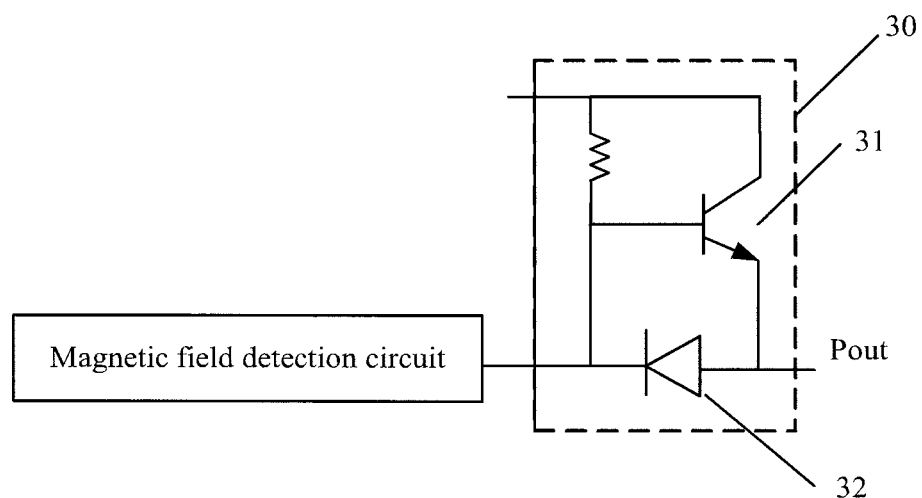
FIG. 9 is a circuit diagram of an output control circuit of a magnetic sensor integrated circuit according to another embodiment of the present disclosure.

In another embodiment of the present disclosure, as shown in FIG. 9, the first switch 31 is a switching transistor switched on at a high level, and the second switch 32 is a unidirectional conduction diode. A control terminal of the first switch 31 and a cathode of the second switch 32 are connected with the magnetic field detection circuit. A current input terminal of the first switch 31 is connected with an output terminal of a rectification circuit, and a current output terminal of the first switch 31 and an anode of the second switch 32 are connected with the output port Pout. The first switch 31 and the output port Pout are connected in the first current path. The output port Pout, the second switch 32 and the magnetic field detection circuit are connected in the second current path. In a case that the magnet detection signal output by the magnetic field detection circuit is a high level, the first switch 31 is switched on, and the second switch 32 is switched off, so that a load current from the rectification circuit flows through the first switch 31 and flows outwards from the output port Pout. In a case that the magnet detection signal output by the magnetic field detection circuit is a low level, the second switch 32 is switched on, and the first switch 31 is switched off, so that the load current flows inwards from outside through the output port Pout and flows through the switch 32. It should be understood that, in other embodiments of the present disclosure, the first switch 31 and the second switch 32 may have other structures, which may be determined according to actual conditions and are not limited in the present disclosure.

In another embodiment of the present disclosure, the output control circuit includes a first current path in which a current flows from the output port to the outside, a second current path in which a current flows from the output port to the inside, and a switch electrically connected to one of the first current path and the second current path. The switch is controlled by magnetic field detection signal output by the signal processing unit, to switch on the first current path and the second current path selectively. Optionally, no switch is arranged in the other path of the first current path and the second current path.

In another embodiment of the present disclosure, the output control circuit 30 includes a one-way switch. The one-way switch and the output port are connected in a first current path. An output terminal of the magnetic field detection circuit and the output port are connected in a second current path. A direction of the second current path is opposite to a direction the first current path. The one-way switch is controlled based on the magnet detection signal. The first current path and the second current path are controlled to be selectively conducted based on the magnet detection signal. Alternatively, the resistor R1 in the second current path may be replaced with a unidirectional conducting switch electrically connected to the unidirectional conducting switch 33 in parallel back to back, such that the load current flowing out of the output port is balanced with the load current flowing into the output port.

Figure 10:
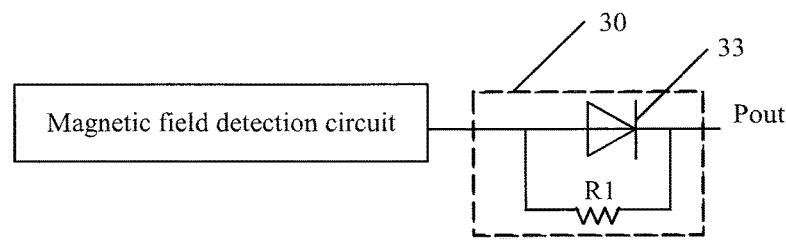
FIG. 10 is a circuit diagram of an output control circuit of a magnetic sensor integrated circuit according to another embodiment of the present disclosure.

As a specific implementation, as shown in FIG. 10, the output control circuit 30 includes a one-way switch 33. The one-way switch 33 and the output port Pout are connected in a first current path. A current input terminal of the one-way switch 33 may be connected with the output terminal of the magnetic field detection circuit. The output terminal of the magnetic field detection circuit may be connected with the output port Pout via a resistor R1 in a second current path. A direction of the second current path is opposite to a direction the first current path. In a case that the magnet detection signal is a high level, the one-way switch 33 is switched on, and the load current flows through the one-way switch 33 and flows outwards through the output port Pout. In a case that the magnet detection signal is a low level, the one-way switch 33 is switched off, and the load current flows inwards from outside through the output port Pout and flows through the resistor R1 and the magnetic field detection circuit.

In the following, the magnetic sensor integrated circuit according to the embodiments of the present disclosure is described in conjunction with a specific application.

Figure 11:
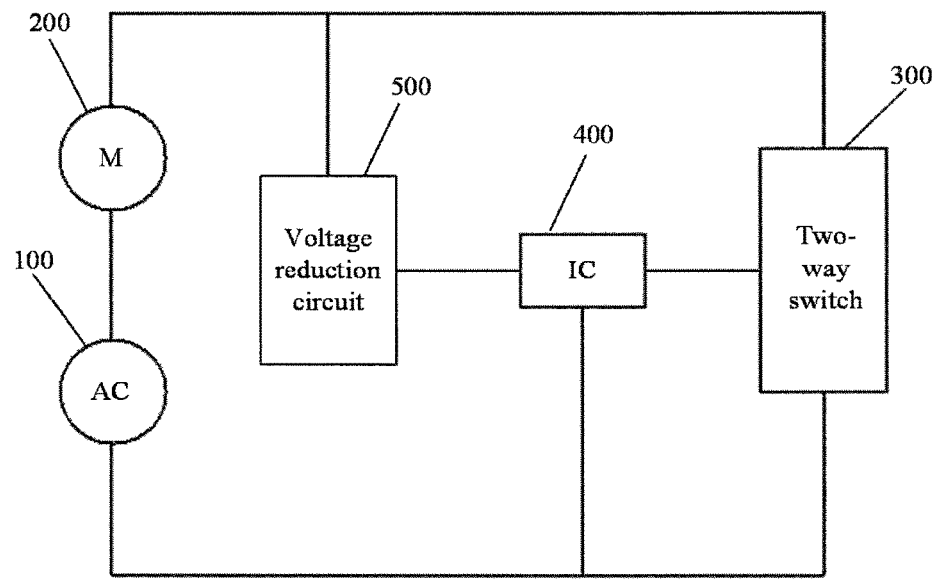
FIG. 11 is a schematic structural diagram of a motor assembly according to an embodiment of the present disclosure.

As shown in FIG. 11, a motor assembly is further provided according to an embodiment of the present disclosure. The motor assembly includes a motor 200 powered by an AC power supply 100, a two-way switch 300 connected in series with the motor 200, and the magnetic sensor integrated circuit 400 according to any one of the above embodiments of the present disclosure. The output port of the magnetic sensor integrated circuit 400 is electrically connected with a control terminal of the two-way switch 300. Preferably, the motor assembly further includes a voltage reduction circuit 500 which is configured to reduce a voltage provided by the AC power supply 100 and supply the reduced voltage to the magnetic sensor integrated circuit 400. The magnetic sensor integrated circuit 400 is arranged close to a rotor of the motor 200, so as to sense a variation in the magnetic field of the rotor.

Figure 12:
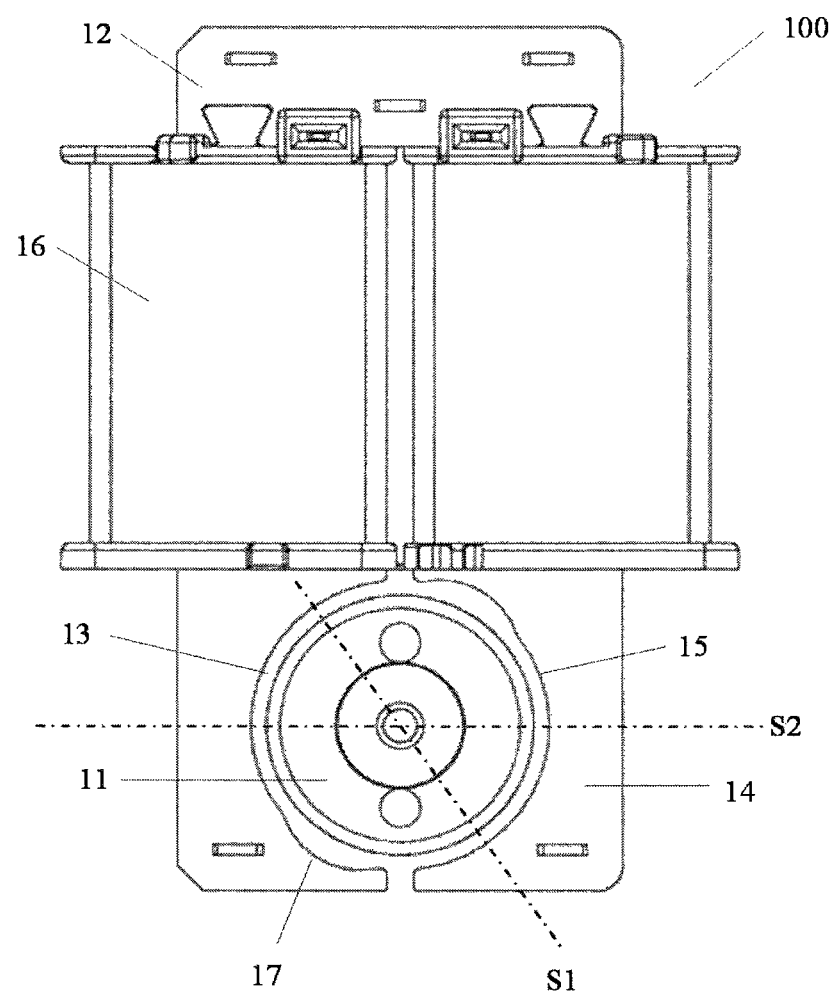
FIG. 12 is a schematic structural diagram of a synchronous motor of a motor assembly according to an embodiment of the present disclosure.

In a specific embodiment of the present disclosure, the motor is a synchronous motor. As shown in FIG. 12, the synchronous motor includes a stator and a rotor 11 rotatable relative to the stator. The stator includes a stator core 12 and a stator winding 16 wound on the stator core 12. The stator core 12 may be made of soft magnetic materials, such as pure iron, cast iron, cast steel, electrical steel, and silicon steel. The rotor 11 includes a permanent magnet. If the stator winding 16 is connected in series with an AC power supply, the rotor 11 operates at a constant speed of 60 f/p rotations per minutes during a steady-state phase, where f is a frequency of the AC power supply, and p is the number of pole-pairs of the rotor. In this embodiment, the stator core 12 includes two opposite pole portions 14, each of which has a pole arc face 15. An outer surface of the rotor 11 is arranged opposite to the pole arc faces 15, and a substantially uniform air gap is formed therebetween. The substantially uniform air gap in the present disclosure refers to that most of the air gap between the stator and the rotor is uniform, and only a small portion of the air gap is non-uniform. Preferably, the pole arc face 15 of the pole portion of the stator is provided with a starting groove 17 which is inwardly concave. Other portions of the pole arc face 15 except for the starting groove 17 are concentric with the rotor. A non-uniform magnetic field can be formed with the above configuration, so that a polar axis S1 of the rotor is angled with respect to a central axis S2 of the pole portions of the stator when the rotor is at rest, thereby allowing the rotor to have a starting torque each time when the motor is powered under the action of the integrated circuit. The pole axis S1 of the rotor is a border line between two magnetic poles of the rotor which have different magnetic polarities. The central axis S2 of the pole portions 14 of the stator is a connection line between center points of two pole portions 14 of the stator. In this embodiment, each of the stator and the rotor has two magnetic poles. It should be understood that, in other embodiments, the number of magnetic poles of the stator may be different from that of the rotor, which may be more than two, such as four or six.

Preferably, the output control circuit 30 is configured to switch on the bidirectional conducting switch 300, when the alternating-current power 100 operates in a positive half cycle and the magnetic sensor detects that a magnetic field of the permanent magnet rotor has a first polarity, or when the alternating-current power 100 operates in a negative half cycle and the magnetic sensor detects that the magnetic field of the permanent magnet rotor has a second polarity opposite to the first polarity. The output control circuit 30 switches off the bidirectional conducting switch 300, when the alternating-current power 100 operates in the negative half cycle and the permanent magnet rotor has the first polarity, or when the alternating-current power 100 operates in the positive half cycle and the permanent magnet rotor has the second polarity.

Based on the above embodiment, in an embodiment of the present disclosure, the output control circuit 30 is configured to control the load current flow to the bidirectional conducting switch 300 from the magnetic sensor integrated circuit, when the alternating-current power 100 operates in the positive half cycle and the magnetic field detection circuit 2 detects that the magnetic field of the permanent magnet rotor with the first polarity. When the alternating-current power 100 operates in the negative half cycle and the magnetic field detection circuit detects that the magnetic field of the permanent magnet rotor with the second polarity opposite to the first polarity; and the output control circuit 30 is configured to control the load current flow to the magnetic sensor integrated circuit from the bidirectional conducting switch 300.

In a preferred embodiment of the present disclosure, the bidirectional conducting switch 300 may be a triode alternating current switch (TRIAC), the output control circuit is implemented as shown in FIG. 9. When the signal output by the AC power supply 100 is in a positive half cycle and the magnetic field detection circuit 2 outputs a low level, the first switch 31 in the output control circuit 30 is switched on, and the second switch 32 in the output control circuit 30 is switched off, so that a current successively flows through the AC power supply 100, the motor 200, a first input terminal of the magnetic sensor integrated circuit 400, the voltage reduction circuit 500, the output terminal of the second diode 612 of the full-wave rectification bridge, and the first switch 31 of the output control circuit 30, and flows from the output port back to the AC power supply 100 via the two-way switch 300. When the bidirectional conducting switch 300 is switched on, a series branch formed by the voltage-decreasing circuit 500 and the magnetic sensor integrated circuit 400 is short-circuited, the magnetic sensor integrated circuit 400 stops outputting due to absence of supply voltage, and the bidirectional conducting switch 300 remains being switched on while no driven current flows between a control pole and a first anode of the bidirectional conducting switch 300, since a current flowing through two anodes of the bidirectional conducting switch 300 is large enough (larger than a holding current of the bidirectional conducting switch 300). When the signal output by the AC power supply 100 is in a negative half cycle and the magnetic field detection circuit 2 outputs a high level, the first switch 31 in the output control circuit 30 is switched off, and the second switch 32 in the output control circuit 30 is switched on, so that a current flows from the AC power supply 100 into the input port via the two-way switch 300, flows through the second switch 32 of the output control circuit 30, the grounded output terminal of the full-wave rectification bridge and the first diode 611, the first input terminal of the magnetic sensor integrated circuit 400, and the motor 200, and flows back to the AC power supply 100. Similarly, when the bidirectional conducting switch 300 is switched on, the magnetic sensor integrated circuit 400 is short-circuited and thus stops outputting, and the bidirectional conducting switch 300 may remain being switched on. When the signal output by the AC power supply 100 is in a positive half cycle and the magnetic field detection circuit 2 outputs a high level, or when the signal output by the AC power supply 100 is in a negative half cycle and the magnetic field detection circuit 2 outputs a low level, both the first switch 31 and the second switch 32 in the output control circuit 30 are switched off, and the bidirectional conducting switch 300 is turned off. Therefore, the output control circuit 30 is capable of enabling, based on the variation in the electrical polarity of the AC power supply 100 and the magnet detection signal, the magnetic sensor integrated circuit to control the bidirectional conducting switch 300 to be switched between the on-state and the off-state in a predetermined manner, so as to control an energization mode of the stator winding 16, such that the varying magnetic field generated by the stator matches a magnetic field position of the rotor and causes the rotor to rotate in a single direction, thereby ensuring that the rotor rotates in a fixed direction each time when the motor is powered.

It should be understood that, the magnetic sensor integrated circuit according to the present disclosure is described above in conjunction with a possible application, but is not limited thereto. For example, the magnetic sensor integrated circuit according to the present disclosure may be used not only for driving a motor, but also for other applications in magnetic field detection.

In a motor according to another embodiment of the present disclosure, the motor may be electrically connected to a bidirectional conducting switch in series between two ends of an external alternating-current power. A first series branch formed by the electric motor and the bidirectional conducting switch is parallel-electrically connected to a second series branch formed by a voltage-decreasing circuit and a magnetic sensor integrated circuit. An output port of the magnetic sensor integrated circuit is electrically connected to the bidirectional conducting switch, to control the bidirectional conducting switch to switch on and switch off in a predetermined manner, thereby controlling a way of powering the stator winding.

The motor assembly according to the above embodiments of the present disclosure is applicable especially to application devices, such as a pump, a fan, a household appliance or a vehicle. The household appliance may be a washing machine, a dishwasher, a range hood, an exhaust fan, or the like.

The embodiments of the specification are described in a progressive way, and each embodiment lays emphasis on differences from other embodiments. For the same or similar parts between the embodiments, one may refer to the description of other embodiments.

It should be further noted that the relationship terminologies such as "first", "second" and the like are only used herein to distinguish one entity or operation from another, rather than to necessitate or imply that the actual relationship or order exists between the entities or operations. Furthermore, terms of "include", "comprise" or any other variants are intended to be non-exclusive. Therefore, a process, method, article or device including a plurality of elements includes not only the elements but also other elements that are not enumerated, or also include the elements inherent for the process, method, article or device. Unless expressively limited otherwise, the statement "comprising (including) one . . . " does not exclude the case that other similar elements may exist in the process, method, article or device.

The above illustration of the disclosed embodiments enables those skilled in the art to implement or practice the present disclosure. Many changes to these embodiments are apparent for those skilled in the art, and general principles defined herein can be implemented in other embodiments without departing the spirit or scope of the present disclosure. Hence, the present disclosure is not limited to the embodiments disclosed herein, but is to conform to the widest scope consistent with principles and novel features disclosed herein.

The invention claimed is:

1. A magnetic sensor integrated circuit, comprising
a housing;
a semiconductor substrate arranged inside the housing;
an electronic circuit provided on the semiconductor substrate;
an output port extending out from the housing and an input port for connecting with an external power supply; and
a reference voltage generation circuit, wherein the reference voltage generation circuit comprises a voltage detection circuit and a voltage divider,
wherein the electronic circuit comprises a magnetic field detection circuit comprising:
 a magnetic sensing element configured to sense an external magnetic field and output an electrical detection signal,
 a signal processing unit configured to amplify the electrical detection signal and remove interference from the electrical detection signal to generate an analog electrical signal; and
 a comparator configured to compare the analog electrical signal with a reference voltage, and output a magnet detection signal to an output control circuit corresponding to the external magnetic field, wherein the reference voltage is generated based on an input common-mode voltage of the magnetic field detection circuit; and
wherein the output control circuit is enabled to operate in at least one of a first state which a current flows outwards from the output port and a second state in which a current flows into the output port from outside according to the magnet detection signal,
wherein the voltage detection circuit is configured to detect a difference between the input common-mode voltage and a reference common-mode voltage and output a corresponding detection current, and
wherein the voltage divider is provided with a pair of output terminals for outputting the pair of differential reference voltages, and an output terminal for outputting the reference common-mode voltage, wherein when the corresponding detection current flows through the voltage divider, a variation in the corresponding detection current causes the reference voltage output by the voltage divider to change correspondingly.

2. The magnetic sensor integrated circuit according to claim 1, wherein the magnetic sensing element is powered by a constant current source.

3. The magnetic sensor integrated circuit according to claim 1, wherein the reference voltage varies with the input common-mode voltage.

4. The magnetic sensor integrated circuit according to claim 1, wherein
an high voltage threshold and a low voltage threshold are acquired by the pair of differential reference voltages being subtracted from each other;
the analog electrical signal comprises a pair of differential voltage signals; and
the comparator comprises a first comparator, a second comparator and a latch logic circuit, wherein each of the first comparator and the second comparator is provided with four input terminals, and the four input terminals respectively receive the pair of differential reference voltages and the pair of differential voltage signals, the pair of differential reference voltages being inversely coupled to the second comparator as compared with the first comparator, wherein
the first comparator is configured to output a comparison result between a voltage difference of the pair of differential voltage signals and the high voltage threshold,
the second comparator is configured to output a comparison result between the voltage difference and the low voltage threshold, and
the latch logic circuit is configured to:
output a first voltage level in a case that the comparison result output by the first comparator indicates that the voltage difference is higher than the higher voltage level,
output a second voltage level in a case that the comparison result output by the second comparator indicates that the voltage difference is lower than the lower voltage level, with the second voltage level being opposite to the first voltage level, and
maintain an output state unchanged in a case that the comparison results output by the first comparator and the second comparator indicate that the voltage difference is between the high voltage threshold and the low voltage threshold.

5. The magnetic sensor integrated circuit according to claim 1, wherein
the electrical detection signal comprises a magnetic field signal and a deviation signal; and
the signal processing unit comprises a chopping switch, a chopper amplifier and a low-pass filter, wherein
the chopping switch is configured to separate the electrical detection signal output by the magnetic sensing element into the deviation signal in a baseband frequency and the magnetic field signal in a chopping frequency,
the chopper amplifier is configured to amplify the deviation signal and the magnetic field signal, and switch the amplified deviation signal and the amplified magnetic field signal into the chopping frequency and the baseband frequency respectively, and
the low-pass filter is configured to filter out the deviation signal switched into the chopping frequency.

6. The magnetic sensor integrated circuit according to claim 1, further comprising a power module, wherein the power module comprises a rectifier, and the rectifier has an input terminal connected with the input port and is configured to convert a voltage provided by the external power supply into a first DC voltage.

7. The magnetic sensor integrated circuit according to claim 1, wherein
the signal processing unit comprises an amplifier configured to amplify the electrical detection signal, and a filter configured to filter out an interference signal in the electrical detection signal; and
the input common-mode voltage is input into the amplifier and the filter.

8. The magnetic sensor integrated circuit according to claim 1, wherein output control circuit comprises a first switch and a second switch, wherein
the first switch and the output port are connected in a first current path, and
the second switch and the output port are connected in a second current path, with a direction of the second current path being opposite to a direction of the first current path, wherein the first current path and the second current path are controlled to be selectively conducted based on the magnet detection signal.

9. The magnetic sensor integrated circuit according to claim 1, wherein the output control circuit comprises a first current path in which a current flows from the output port to an outside, a second current path in which a current flows from the output port to an inside, and a switch electrically connected to one of the first current path and the second current path; and the switch is controlled by magnetic field detection signal output by the signal processing unit, to switch on the first current path and the second current path selectively.

10. The magnetic sensor integrated circuit according to claim 1, wherein
the external power supply is an AC power supply; and
the output control circuit is configured to:
enable the magnetic sensor integrated circuit to operate in one of the first state and the second state in a case that the magnetic detection signal indicates that the external magnetic field is a first polarity, and the AC power supply operates in a first half cycle, and
enable the magnetic sensor integrated circuit to operate in the other one of the first state and the second state in a case that the magnetic detection signal indicates that the external magnetic field is a second polarity, and the AC power supply operates in a second half cycle.

11. A motor assembly, comprising a motor and a motor drive circuit,
wherein the motor drive circuit comprises the magnetic sensor integrated circuit according to claim 1.

12. The magnetic sensor integrated circuit according to claim 6, wherein the power module further comprises a voltage regulating unit configured to convert the first DC voltage output by the rectifier into a second DC voltage, with an average of the first DC voltage being greater than an average of the second DC voltage.

13. The magnetic sensor integrated circuit according to claim 7, wherein
the magnetic field detection circuit is powered by the second DC voltage; and
the input common-mode voltage is half of the second DC voltage.

14. The motor assembly according to claim 11, wherein the motor comprises a stator and a permanent magnet rotor, and wherein the stator comprises a stator core and a single-phase winding wound on the stator score.

15. An application device, comprising the motor assembly according to claim 11.

16. The magnetic sensor integrated circuit according to claim 12, wherein
- the power module further comprises a current source generation circuit, and the current source generation circuit is powered by the second DC voltage and is configured to generate a constant current source which does not change with temperature; and
- the magnetic sensing element is powered by the constant current source.

17. The application device according to claim 14, wherein the application device is a pump, a fan, a household appliance or a vehicle.

* * * * *